United States Patent
Martin et al.

(10) Patent No.: US 11,667,128 B2
(45) Date of Patent: Jun. 6, 2023

(54) FLUIDIC DIE WITH MONITORING CIRCUIT FAULT PROTECTION STRUCTURE

(71) Applicant: Hewlett-Packard Development Company, L.P., Spring, TX (US)

(72) Inventors: Eric Martin, Corvallis, OR (US); Terry McMahon, Corvallis, OR (US); Donald W Schulte, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 330 days.

(21) Appl. No.: 17/046,877

(22) PCT Filed: May 15, 2018

(86) PCT No.: PCT/US2018/032763
§ 371 (c)(1),
(2) Date: Oct. 12, 2020

(87) PCT Pub. No.: WO2019/221706
PCT Pub. Date: Nov. 21, 2019

(65) Prior Publication Data
US 2021/0146695 A1   May 20, 2021

(51) Int. Cl.
| | |
|---|---|
| *B41J 2/175* | (2006.01) |
| *H01L 23/62* | (2006.01) |
| *H01L 27/092* | (2006.01) |
| *H01L 29/06* | (2006.01) |
| *H03K 17/687* | (2006.01) |

(52) U.S. Cl.
CPC .......... *B41J 2/17566* (2013.01); *H01L 23/62* (2013.01); *H01L 27/092* (2013.01); *H01L 29/0619* (2013.01); *B41J 2002/17579* (2013.01); *H03K 17/6871* (2013.01)

(58) Field of Classification Search
CPC ........ B41J 2002/17579; B41J 2002/061; B41J 2/17566
See application file for complete search history.

(56) References Cited

U.S. PATENT DOCUMENTS

| | | | |
|---|---|---|---|
| 6,541,794 | B1 | 4/2003 | Patterson et al. |
| 6,750,517 | B1 | 6/2004 | Ker et al. |
| 7,064,396 | B2 | 6/2006 | Chen et al. |

(Continued)

FOREIGN PATENT DOCUMENTS

WO   WO-2013055356   4/2013

*Primary Examiner* — Lam S Nguyen
(74) *Attorney, Agent, or Firm* — Foley & Lardner LLP

(57) ABSTRACT

A fluidic die includes fluid chambers, each including an electrode exposed to an interior of the fluid chamber and each having a corresponding fluid actuator operating at a high voltage. The fluidic die further includes monitoring circuitry, operating at a low voltage relative to the fluid actuator, to monitor a condition of each fluid chamber, for each chamber the monitoring circuitry including a connection structure and a select transistor and a pulldown transistor connected to the electrode via the connection structure. The connection structure and select and pulldown transistors together structured to form electrically conductive paths with electrical resistances to protect at least the select transistor from fault damage if the high voltage fluid actuator short-circuits to the electrode.

15 Claims, 8 Drawing Sheets

(56) References Cited

U.S. PATENT DOCUMENTS

| | | | |
|---|---|---|---|
| 7,795,966 B2 | 9/2010 | Wyse | |
| 8,174,060 B2 | 5/2012 | Curello et al. | |
| 9,466,669 B2 | 10/2016 | Rodder et al. | |
| 9,748,243 B2 | 8/2017 | Yoon et al. | |
| 9,806,094 B2 | 10/2017 | Whitefield | |
| 10,926,548 B2 * | 2/2021 | Anderson | B41J 2/17566 |
| 2008/0094446 A1 * | 4/2008 | Sheahan | B41J 2/04563 |
| | | | 347/40 |
| 2014/0204148 A1 * | 7/2014 | Ge | B41J 2/17566 |
| | | | 347/19 |
| 2014/0375711 A1 | 12/2014 | Fujii et al. | |
| 2015/0273848 A1 * | 10/2015 | Ge | B41J 2/1404 |
| | | | 347/7 |
| 2017/0036452 A1 | 2/2017 | Ge et al. | |

* cited by examiner

FLUIDIC DIE WITH MONITORING CIRCUIT FAULT PROTECTION STRUCTURE

BACKGROUND

Fluidic dies may include an array of nozzles and/or pumps each including a fluid chamber and a fluid actuator, where the fluid actuator may be actuated to cause displacement of fluid within the chamber. Some example fluidic dies may be printheads, where the fluid may correspond to ink.

Figure 1:
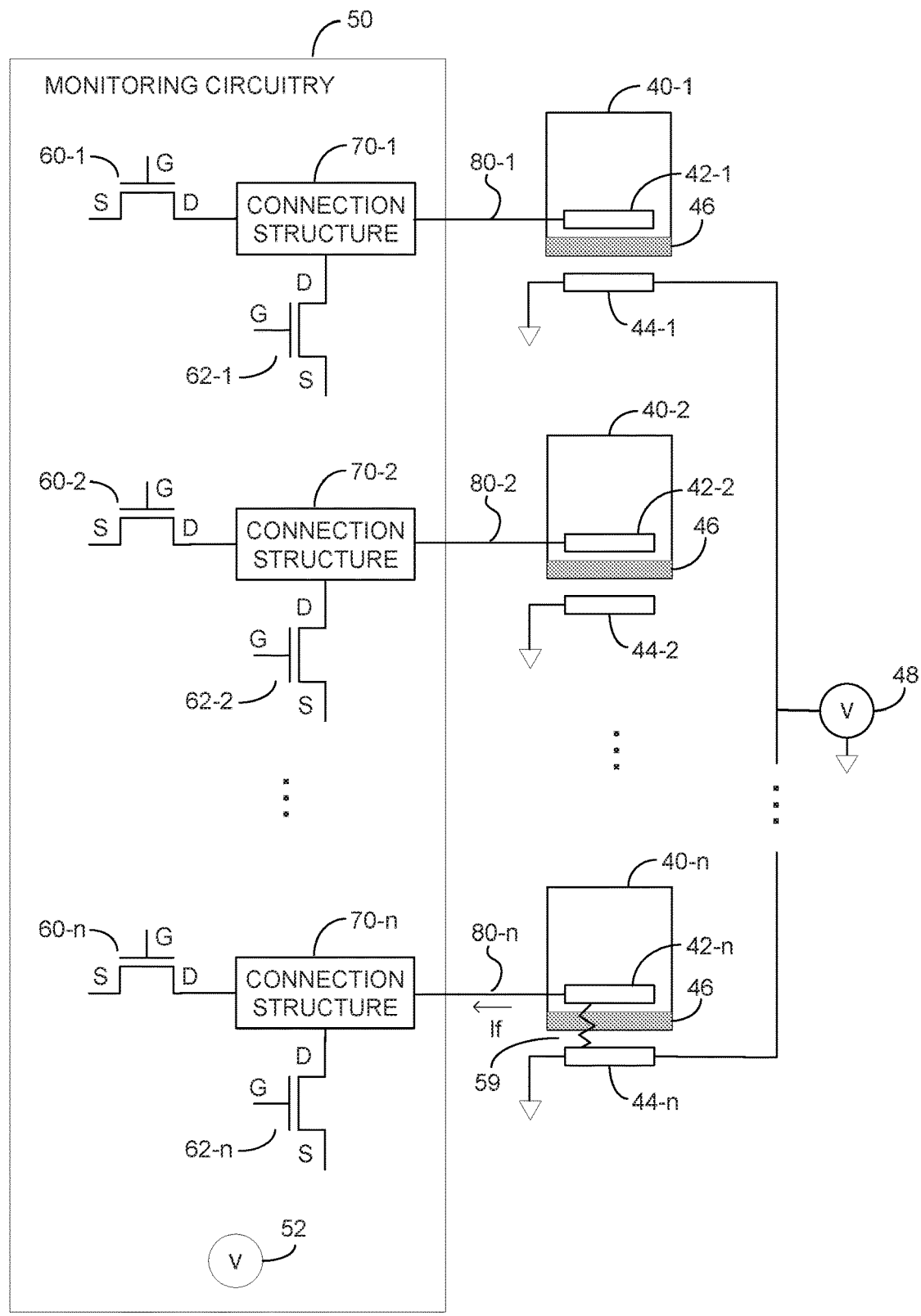
FIG. 1 is a block and schematic diagram illustrating a fluidic die, according to one example.

Throughout the drawings, identical reference numbers designate similar, but not necessarily identical, elements. The figures are not necessarily to scale, and the size of some parts may be exaggerated to more clearly illustrate the example shown. Moreover the drawings provide examples and/or implementations consistent with the description; however, the description is not limited to the examples and/or implementations provided in the drawings.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Examples of fluidic dies may include fluid actuators. The fluid actuators may include thermal resistor based actuators, piezoelectric membrane based actuators, electrostatic membrane actuators, mechanical/impact driven membrane actuators, magneto-strictive drive actuators, or other suitable devices that may cause displacement of fluid in response to electrical actuation. Fluidic dies described herein may include a plurality of fluid actuators, which may be referred to as an array of fluid actuators. An actuation event or firing event, as used herein, may refer to singular or concurrent actuation of fluid actuators of the fluidic die to cause fluid displacement.

In example fluidic dies, the array of fluid actuators may be arranged in sets of fluid actuators, where each such set of fluid actuators may be referred to as a "primitive" or a "firing primitive." The number of fluid actuators in a primitive may be referred to as a size of the primitive. The set of fluid actuators of a primitive generally have a set of actuation addresses with each fluid actuator corresponding to a different actuation address of the set of actuation addresses. In some examples, electrical and fluidic constraints of a fluidic die may limit which fluid actuators of each primitive may be actuated concurrently for a given actuation event. Primitives facilitate addressing and subsequent actuation of fluid actuator subsets that may be concurrently actuated for a given actuation event to conform to such constraints.

To illustrate by way of example, if a fluidic die comprises four primitives, with each primitive including eight fluid actuators (with each fluid actuator corresponding to different one of the addresses 0 to 7), and where electrical and fluidic constraints limit actuation to one fluid actuator per primitive, a total of four fluid actuators (one from each primitive) may be concurrently actuated for a given actuation event. For example, for a first actuation event, the respective fluid actuator of each primitive corresponding to address "0" may be actuated. For a second actuation event, the respective fluid actuator of each primitive corresponding to address "5" may be actuated. As will be appreciated, the example is provided merely for illustration purposes, such that fluidic dies contemplated herein may comprise more or fewer fluid actuators per primitive and more or fewer primitives per die.

Example fluidic dies may include fluid chambers, orifices, and/or other features which may be defined by surfaces fabricated in a substrate of the fluidic die by etching, microfabrication (e.g., photolithography), micromachining processes, or other suitable processes or combinations thereof. Some example substrates may include silicon based substrates, glass based substrates, gallium arsenide based substrates, and/or other such suitable types of substrates for microfabricated devices and structures. As used herein, fluid chambers may include ejection chambers in fluidic communication with nozzle orifices from which fluid may be ejected, and fluidic channels through which fluid may be conveyed. In some examples, fluidic channels may be microfluidic channels where, as used herein, a microfluidic channel may correspond to a channel of sufficiently small size (e.g., of nanometer sized scale, micrometer sized scale, millimeter sized scale, etc.) to facilitate conveyance of small volumes of fluid (e.g., picoliter scale, nanoliter scale, microliter scale, milliliter scale, etc.).

In some examples, a fluid actuator may be arranged as part of a nozzle where, in addition to the fluid actuator, the nozzle includes an ejection chamber in fluidic communication with a nozzle orifice. The fluid actuator is positioned relative to the fluid chamber such that actuation of the fluid actuator causes displacement of fluid within the fluid chamber that may cause ejection of a fluid drop from the fluid chamber via the nozzle orifice. Accordingly, a fluid actuator arranged as part of a nozzle may sometimes be referred to as a fluid ejector or an ejecting actuator.

In one example nozzle, the fluid actuator comprises a thermal actuator which is spaced from the fluid chamber by an insulating layer, where actuation (sometimes referred to as "firing") of the fluid actuator heats the fluid to form a gaseous drive bubble within the fluid chamber that may cause a fluid drop to be ejected from the nozzle orifice, after which the drive bubble collapses. In some examples, a cavitation plate is disposed within the fluid chamber so as to be above the fluid actuator and in contact with the fluid within the chamber, where the cavitation plate protects material underlying the fluid chamber, including the underlying insulating material and fluid actuator, from cavitation forces resulting from generation and collapse of the drive bubble. In examples, the cavitation plate may be metal (e.g., tantalum).

In some examples, a fluid actuator may be arranged as part of a pump where, in addition to the fluidic actuator, the pump includes a fluidic channel. The fluidic actuator is positioned relative to a fluidic channel such that actuation of the fluid actuator generates fluid displacement in the fluid channel (e.g., a microfluidic channel) to convey fluid within the fluidic die, such as between a fluid supply (e.g., fluid slot) and a nozzle, for instance. A fluid actuator arranged to convey fluid within a fluidic channel may sometimes be referred to as a non-ejecting actuator. In some examples, similar to that described above with respect to a nozzle, a metal cavitation plate may be disposed within the fluidic channel above the fluid actuator to protect the fluidic actuator and underlying materials from cavitation forces resulting from generation and collapse of drive bubbles within the fluidic channel.

Fluidic dies may include an array of fluid actuators (such as columns of fluid actuators), where the fluid actuators of the array may be arranged as fluid ejectors (i.e., having corresponding fluid ejection chambers with nozzle orifices) and/or pumps (having corresponding fluid channels), with selective operation of fluid ejectors causing fluid drop ejection and selective operation of pumps causing fluid displacement within the fluidic die. In some examples, the array of fluid actuators may be arranged into primitives.

During operation of the fluidic die, conditions may arise that adversely affect the ability of nozzles to properly eject fluid drops and pumps to properly convey fluid within the die. For example, a blockage may occur in a nozzle orifice, ejection chamber, or fluidic channel, fluid (or components thereof) may become solidified on surfaces within a fluid chamber, such as on a cavitation plate, or a fluid actuator may not be functioning properly.

To determine when such conditions are present, techniques have been developed to measure various operating parameters (e.g., impedance, resistance, current, voltage) of nozzles and pumps using a sense electrode which is disposed so as to be exposed to an interior of the fluid chamber. In one case, in addition to protecting fluid actuators and other elements from cavitation forces, cavitation plates may also serve as sense electrodes. In one example, the sense electrode may be used to measure an impedance of fluid within the chamber when the nozzle and/or pump is inactive (i.e., not being fired), where such impedance may be correlated to a temperature of the fluid, fluid composition, particle concentration, and a presence of air, among others, for instance.

Drive bubble detect (DBD) is one technique which measures parameters indicative of the formation of a drive bubble within a fluid chamber to determine whether a nozzle or pump is defective (i.e. not operating properly). In one example, for a given fluid chamber, during an actuation event, a high-voltage (e.g., 32 V) is applied to the corresponding fluid actuator to vaporize at least one component of a fluid (e.g., water) to form a drive bubble within the fluid chamber. In one example, at one or more selected times after a fluid actuator has been fired (e.g., after expected formation but before collapse of the drive bubble), low-voltage (e.g., 5 V) DBD monitoring circuitry on the fluidic die selectively couples to the cavitation plate within the fluid chamber. In one example, the DBD monitoring circuitry provides a current pulse to the electrically conductive cavitation plate which flows through an impedance path formed by fluid and/or gaseous material of the drive bubble within the ejection chamber to a ground point. Based on the current pulse (e.g. based on a resulting voltage across the chamber), the DBD monitoring circuitry measures an impedance of the fluid chamber which indicative of the operating condition of the nozzle or pump (e.g., the nozzle/pump is operating properly, a nozzle orifice is plugged, etc.).

The impedance measured by fluid chamber monitoring circuitry (such as DBD monitoring circuitry) includes several fixed impedance components and a variable impedance component in the form of fluid within the fluid chamber. According to one example, the fixed impedance components include, among others, a parasitic resistance formed by the electrode (e.g., the cavitation plate) and connections between the monitoring circuit and the electrode, and a capacitance between circuit elements (e.g., conductors) connecting the monitoring circuit and a substrate or conductive layers adjacent to such circuit elements, and a capacitance between the cavitation plate and the fluid actuator. To improve an effectiveness of the impedance measurements by the monitoring circuitry and more accurately identify operating conditions of fluid chambers, it is desirable to minimize an amount of a measured impedance value represented by the fixed impedance components.

FIG. 1 is a block and schematic diagram generally illustrating a fluidic die 30, according to one example of the present disclosure, having monitoring circuitry operating at a low-voltage for monitoring a condition of one or more fluid chambers via a sense electrode disposed, at least partially, within an interior of each fluid chamber. In one example, such monitoring circuitry may comprise DBD monitoring circuitry. In one example, for each fluid chamber, the monitoring circuit includes a select transistor and a pulldown transistor to selectively connect to the electrode via a connection structure, with the connection structure and select and pulldown transistors together forming electrically conductive paths structured with impedances to prevent damage to the low-voltage monitoring circuitry if the high-voltage fluid actuator short-circuits to the electrode.

In one example, fluidic die 30 includes a plurality of fluid chambers 40 (illustrated as fluid chambers 40-1 to 40-n), with each chamber including an electrode 42 (illustrated as electrodes 42-1 to 42-n) disposed therein. In one example, electrode 42 comprises a cavitation plate 42 disposed at a bottom of fluid chamber 40. Each fluid chamber 42 has a corresponding fluid actuator 44 (illustrated as fluid actuators 44-1 to 44-n) which is separated from the fluid chamber 40 and electrode 42, such as by an insulating material 46 (e.g., an oxide layer). In one example, fluid actuators 44 operate at a high voltage 48 (e.g., 15 volts) and, when actuated, may cause vaporization of fluid within fluid chamber 40 to form a drive bubble therein. In the case of a nozzle, where fluid chamber 40 is in fluidic communication with a nozzle orifice, formation of a drive bubble via actuation of fluid actuator 44 may cause ejection of a fluid drop (e.g., ink) from fluid chamber 40 via the nozzle orifice. In a case where fluid chamber 40 is a pump, formation of a drive bubble by actuation of fluid actuator 44 may cause conveyance of fluid within fluidic die 30 (e.g., to/from a nozzle).

In one example, fluidic die 30 includes monitoring circuitry 50 for monitoring an operating condition of each of the plurality of fluid chambers 40, where monitoring circuitry 50 operates at a low voltage 52 (e.g., 5 V) relative to the high voltage 48 at which fluid actuators 44 operate. In one case, monitoring circuitry 50 may comprise DBD monitoring circuitry. According to one example, for each fluid chamber 40, monitoring circuitry 50 includes a select transistor 60 (illustrated as select transistors 60-1 to 60-n) and a pulldown transistor 62 (illustrated at pulldown transistors 62-1 to 62-n) which operate to selectively connect to the corresponding cavitation plate 42 via connection structure 70 (illustrated as connection structures 70-1 to 70-n), with cavitation structure 70 electrically connected to the corresponding cavitation plate 42 via a connection 80 (illustrated as connections 80-1 to 80-n).

In one example, select and pulldown transistors 60 and 62 comprise low-voltage rated devices suitable for use at operating voltage 52. In one example, select and pulldown switches 60 and 62 include a gate (G), a source region (S), and a drain region (D), where one of the source regions (S) and drain regions (D) is electrically connected to connection structure 70. In one example, as illustrated, the drain region (D) of each select and pulldown transistor 60 and 62 is connected to connection structure 70. In other examples, source regions (S) of select and pulldown transistors 60 and 62 may be coupled to connection structure 70 in lieu of drain regions (D).

As will be described in greater detail herein, according to examples, for each fluid chamber 40, the connection structure 70 and select and pulldown transistors 60 and 62 together form electrically conductive paths structured with impedances to prevent damage to low-voltage monitoring circuitry 50, including at least to select switches 60, that might otherwise occur from exposure to high voltage 48 should a fluid actuator 44 short-circuit to cavitation plate 42.

Figure 2:
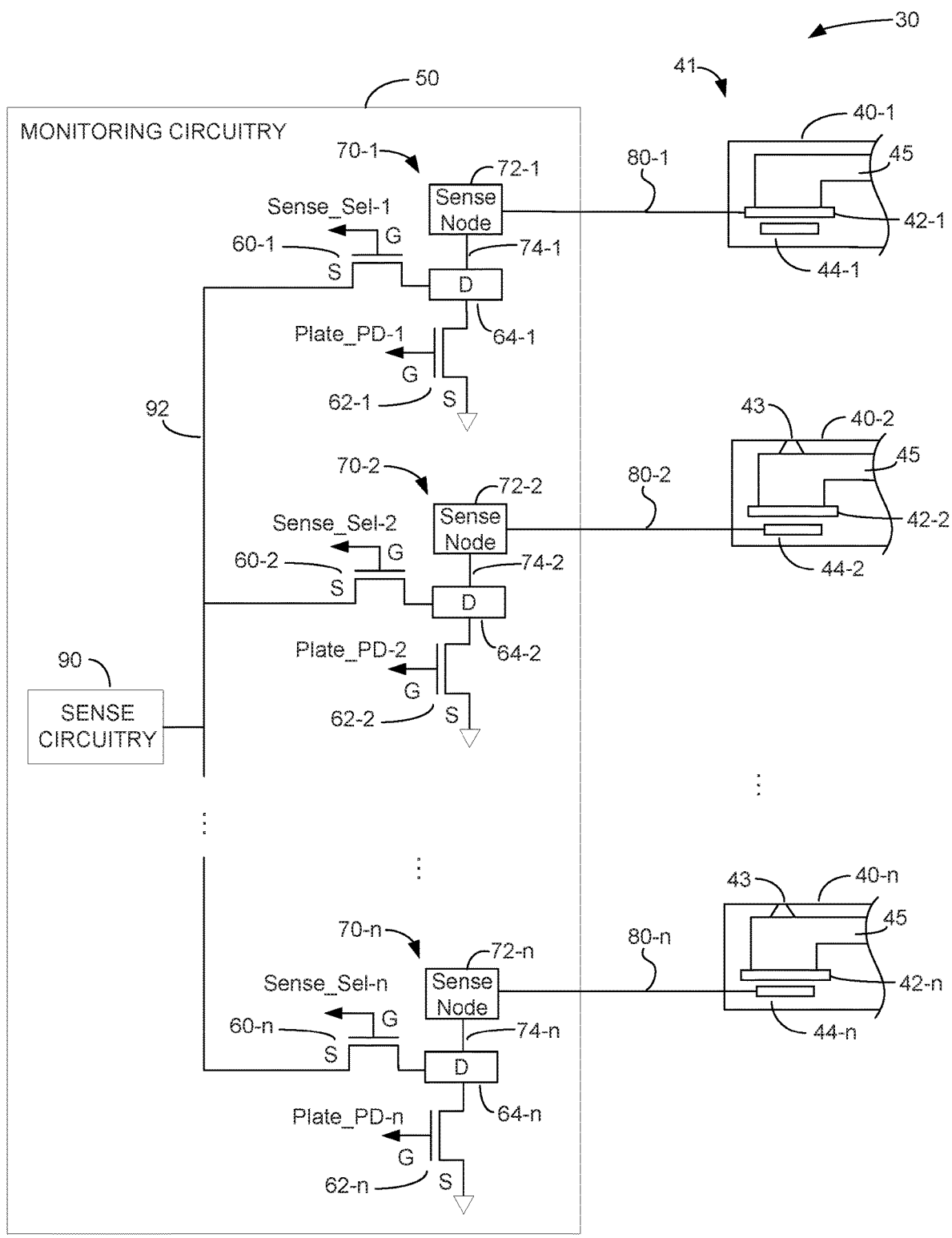
FIG. 2 is a block and schematic diagram illustrating a fluidic die, according to one example.

FIG. 2 is a block and schematic diagram generally illustrating portions of fluidic die 30, according to one example. In one example, the plurality of fluid actuators 44 is arranged to form a primitive 41, where a portion of the fluid actuators 44 may be arranged as part of a nozzle where the corresponding fluid chamber 40 is in fluidic communication with a nozzle orifice 43 (such as illustrated by fluid chambers 40-2 and 40-n, for instance), and a portion may be arranged as part of a pump (such illustrated by fluid chamber 40-1, for instance). In one example, each cavitation plate 42 is disposed within the corresponding fluid chamber 40 so as to be exposed to an interior thereof and which may be in contact with a fluid 45 if present therein (e.g., ink).

In one example, each select and pulldown transistor 60 and 62 is a MOS FET (e.g., NMOS, PMOS) having a source region (S) and a drain region (D) connected to the corresponding sense node 54. Space may be limited on fluidic die 30, particularly in regions of fluidic die 30 proximate to fluid chambers 40. In one example, as illustrated, to conserve space, select and pulldown transistors 60 and 62 for a fluid chamber 40 may share a drain region (D), as indicated by shared drain regions 64-1 to 64-n in FIG. 2. In other examples, the source region (S) may be shared.

In one example, as illustrated, for each fluid chamber 40, connection structure 70 includes a sense node 72 (illustrated as sense nodes 72-1 to 72-n) and a drain contact 74 (illustrated as drain contacts 74-1 to 74-n) electrically connected to shared drain region 64, with sense node 72, in-turn, being electrically connected to the corresponding cavitation plate 42 (or other electrode) via conductor 80.

In one example arrangement, as illustrated, the source region (S) of each select FET 60 is coupled to sense circuitry 90 via a sense line 92, and the source region (S) of each pulldown FET 62 coupled to a reference voltage (e.g., a 0V reference, or ground). Monitoring circuitry 50 further includes a sense select signal (Sense_Sel) to the gate of each select FET 60 (illustrated as sense select signals Sense_Sel-1 to Sense_Sel-n), a plate pulldown signal (Plate_PD) to the gate of each pulldown FET 62 (illustrated as plate pulldown signals Plate_PD-1 to Plate_PD-n). In one example, as described below, to further conserve space on fluidic die 30, select FETs 60 of adjacent fluid chambers 40 may share a source region (S), and pulldown FETs 62 of adjacent fluid chambers 40 may share a source region (S).

During normal firing events of fluid actuators 44 (e.g., to eject fluid via nozzles and convey fluid within fluidic die 30 via pumps), according to examples, monitoring circuitry 50, via the Plate_PD signals, maintains pulldown FETs 62 in an enabled state (e.g., a closed position) so as to maintain cavitation plates 42 at a "safe" voltage (e.g., ground), and maintains select FETs 60 in a disabled state (e.g., an open position) to as to isolate sense circuitry 90, from cavitation plates 42.

During a sensing operation, such as a DBD sense operation, monitoring circuitry 50 connects a cavitation plate 42 of only one fluid chamber 40 at a time to sense circuitry 90 by enabling the select FET 60 of the selected fluid chamber 40 via the Sense_Sel signals, and by disabling the corresponding pulldown FET 62. As described above, in one example, sense circuitry 90 provides a sense current (e.g., a current pulse) through fluid 45 and/or vaporized portions thereof within the selected fluid chamber 40 via cavitation plate 42 and monitors a resulting voltage on sense node 72 to evaluate an operating condition of the selected fluid chamber 40.

Figure 3:
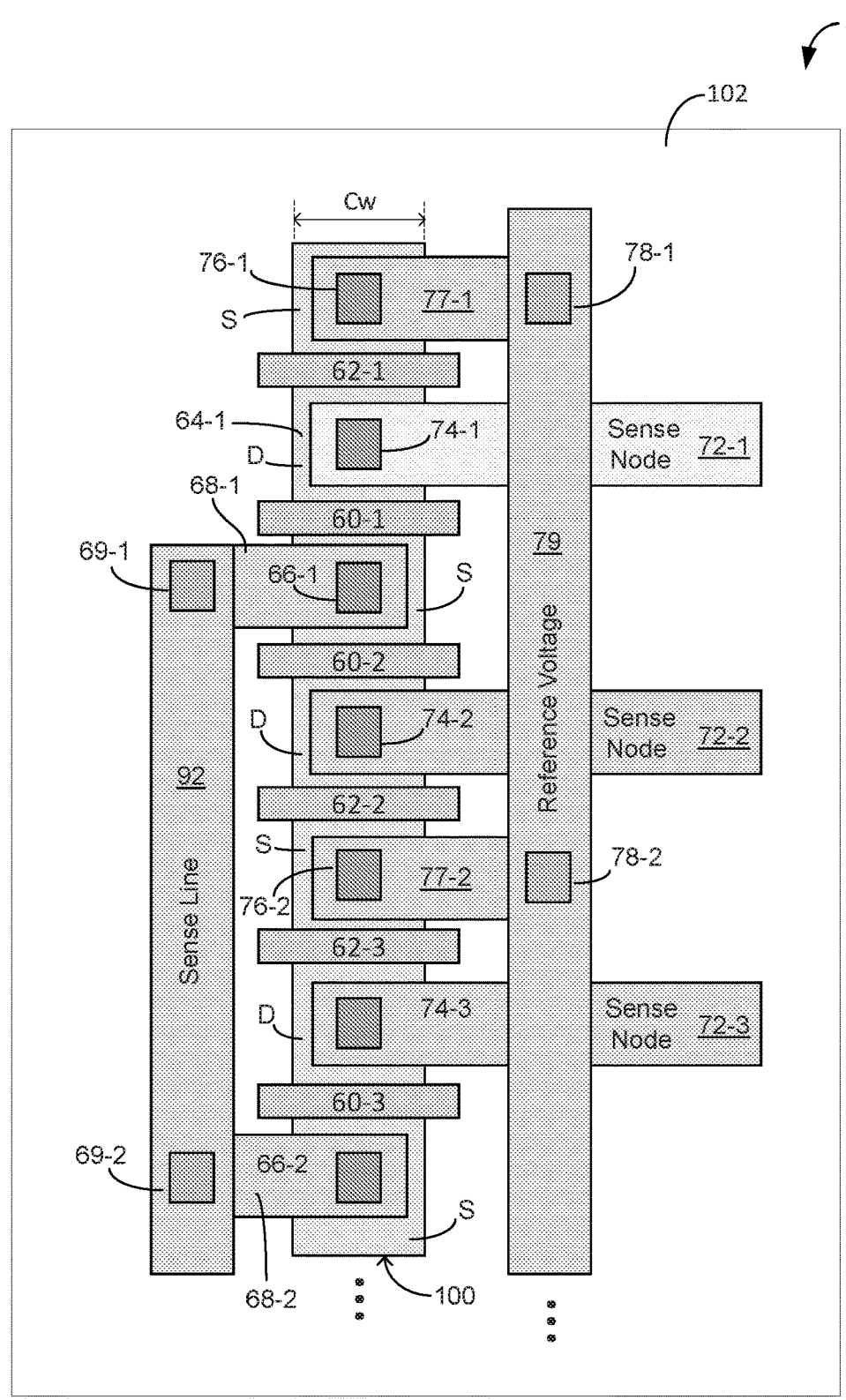
FIG. 3 is a schematic diagram illustrating a plan view of a device and wiring layout of a fluidic die, according to one example.

FIG. 3 is a plan view illustrating a simplified wiring and device layout of a portion of fluidic die 30 of FIG. 2, according to one example. Gates of select and pulldown FETs 60 (e.g., polysilicon material) are illustrated at 60-1 to 60-3 and 62-1 to 62-3 as being disposed over active source and drain regions 100 (implant regions) in a substrate 102 of fluidic die 30, with the active regions alternating as source and drain regions (indicated as "S" and "D"). In a case of select and pulldown FETs 60 and 62 being NMOS FETs, source and drain regions 100 comprise n-doped regions within a p-type substrate 102. Conventionally, source and drain regions 80 are arranged in a column having a width (Cw) which defines a gate width of select and pulldown FETs 60 and 62 (with a gate defined as an overlapping or intersecting region between polysilicon material and active regions).

With area on fluidic die 30 being limited, to save space, monitoring circuitry 50, including sense circuitry 90, is shared between fluid chambers 40 of primitive 41, with only one cavitation plate 42 of a selected fluid chamber 40 being coupled to sense circuitry 90 at a time via control of select and pulldown FETs 60 and 62. Additionally, as described above, with sense and pulldown FETs 60 and 62 being instantiated in a region of high circuit density on fluidic die 30, in some example arrangements, adjacent sense and pulldown FETs 60 and 62 may share drain and source regions 100 and corresponding drain and source contacts to minimize required circuit space.

For instance, as described above, the pair of sense and pulldown FETs 60 and 62 for each fluid chamber 40 share a drain region (D) 64 and drain contact 74, with the shared drain contact 74 being connected to the corresponding sense node 72, such as illustrated by select and pulldown FETs 60-1 and 62-1 sharing source region (D) 64-1 which is electrically connected by shared drain contact 74-1 to sense node 72-1.

In another example, pairs of select FETs 60 of adjacent fluid chambers 40 may share a source region "S" and a source contact 66, such as illustrated by select FETs 60-1 and 60-2 sharing source region "S" and a shared source contact 66-1. In one example, the shared contact 66 is connected to a corresponding source node 68 which, in-turn, is connected to sense line 92 by a via 69, such as illustrated by shared contact 66-1 of select FETs 60-1 and 60-2 being connected to a corresponding source node 68-1 and, in-turn, to sense line 92 by a via 69-1.

In another example, pairs of pulldown FETs 62 of adjacent fluid chambers 40 share a source region "S" and a source contact 76, such as illustrated by pulldown FETs 62-3 and 62-3 sharing source region (S). In one example, shared source contact 76 to a corresponding reference voltage node 77 which, in-turn, is connected to a reference voltage line (e.g., a ground line) 79 by a via 78, such as illustrated by shared source contact 76-2 of pulldown FETs 62-2 and 62-3 being connected to a corresponding reference node 77-2 and, in-turn, to reference voltage line 79 by via 78-2.

In some examples, to further minimize space requirements and to also minimize impedance between source/drain contacts and a corresponding gate, a dimension "x" between a gate and contact, such as between gate 62-1 and source contact 74-1, for example, is minimized according to process limitations. It is noted that, according to convention, horizontally and vertically extending conductive traces are arranged in alternating metal layers. For instance, according to one example, horizontally extending conductive traces are arranged in a Metal1 layer (e.g., sense node 72, source node 68, and ground node 77) and vertically extending conductive traces are arranged in a Metal 2 layer (e.g., ground line 79 and sense line 92), and so on.

Figure 4:
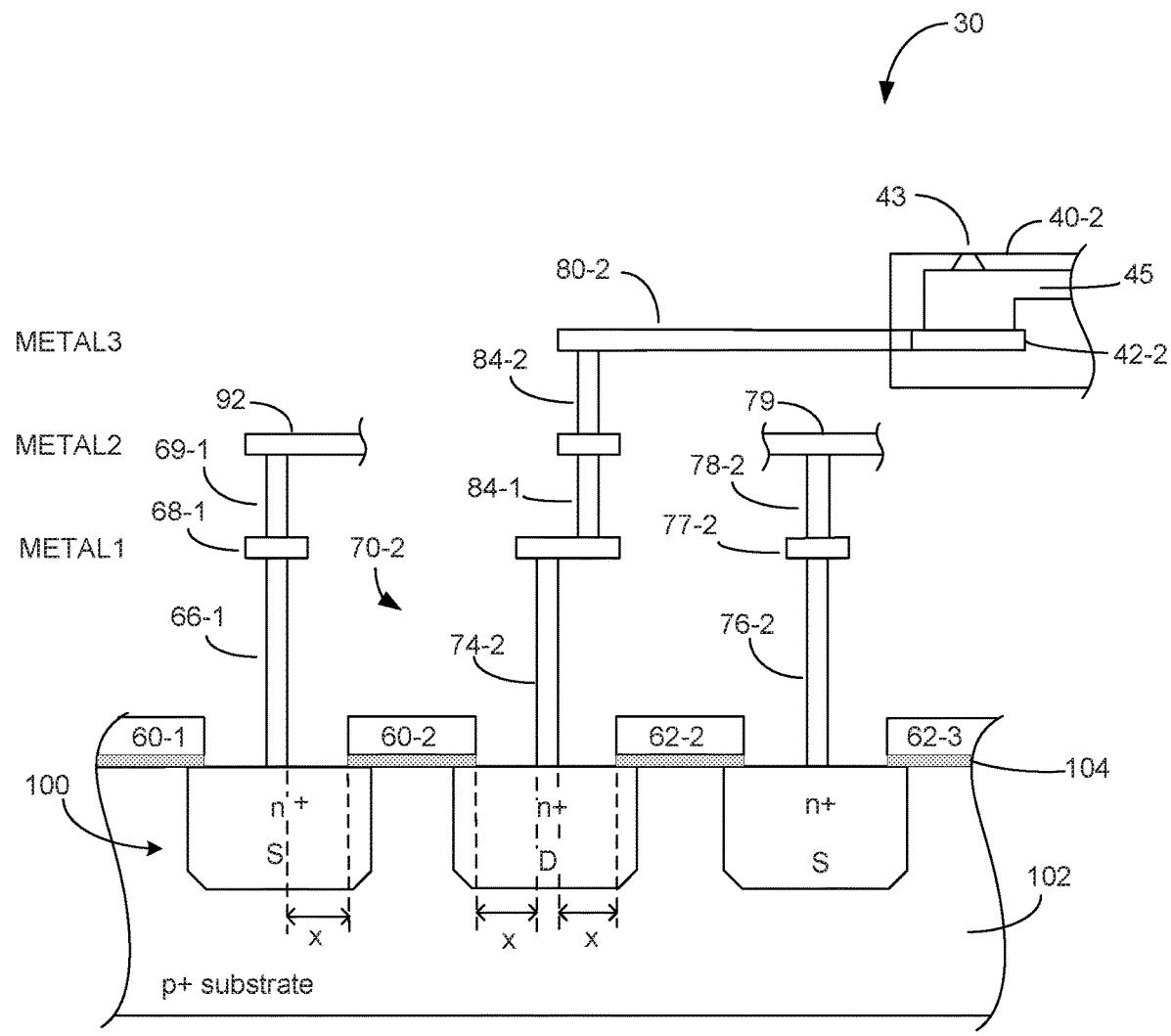
FIG. 4 is a schematic diagram illustrating cross-sectional view of a device and wiring layout of a fluidic die, according to one example

FIG. 4 is a cross-sectional view generally illustrating a simplified layout of a portion of fluidic die 30 of FIG. 3, according to one example. Polysilicon gates of select switches 60-1 and 60-2, and pulldown switches 62-2 and 62-3 are illustrated as being disposed on corresponding gate oxide layers 104 on a surface of substrate 102. Select FETs 60-1 and 60-2 share a source region "S" and source contact 66-1, with source contact 66-1 connecting the shared source region "S" to source node 68-1 which, in-turn, is connected to sense line 92 by via 69-1. Pulldown FETs 62-2 and 62-3 share a source region "S" and source contact 76-2, with source contact 76-2 connecting the shared source region "S" to ground node 77-2 which, in-turn, is connected to ground line 79 by via 78-2.

In one example, as illustrated, select FET 60-2 and pulldown FET 62-2 share a drain region "D" (64-1) and drain contact 74-2, with drain contact 74-2 connecting the shared drain region "D" to sense node 72-2. Sense node 72-2 is connected to conductor 80-2 disposed in metal3 through metal2 by vias 84-1 and 84-2, with conductor 80-2, in-turn, being connected to cavitation plate 42-2 of fluid chamber 40-2.

As illustrated by FIGS. 3 and 4, space requirements for monitoring circuitry 50 may be minimized by sharing source "S" and drain "D" contacts between adjacent select and pulldowns FETs 60 and 62, and by minimizing a spacing between gate poly and source/drain contacts to a minimum distance "x" according to process limitations. While a compact arrangement of sense and pulldown FETs 60 and 62 reduces required circuit area for monitoring circuitry 50 on fluidic die 30, such a compact arrangement may be susceptible to damage from an overvoltage condition resulting from a short circuit of a fluid actuator 44 to a cavitation plate 42, even when monitoring circuitry 50 is decoupled from sense nodes 72 (i.e., when select and pulldown FETs 60 and 62 are "disabled").

For example, with select FETs 60 and pulldown FETs 62 sharing a drain region and drain contact 74, a high voltage on a sense node 54 resulting from a short circuit of a fluid actuator 44 to a cavitation plate 42 may result in a high voltage (a fault voltage) at the shared drain contact 74. If the fault voltage exceeds a breakdown voltage of a pn-junction between the drain region and substrate, a fault current could flow into the drain region via the drain contact 74 (see FIG. 7, for example) that could potentially damage the drain contact 74, the shared drain region, and the gate poly of both the select FET 60 and the pulldown FET 62. For instance, select FET 60-2 and pulldown FET 62-2 corresponding to fluid chamber 40-2 may be damaged if fluid actuator 44-2 shorts to cavitation plate 42-2 and places a high voltage on shared drain contact 74-2 via conductor 80-2 and sense node 72-2. If select FET 60-1 is damaged and unable to isolate sense circuitry 90 from sense node 72-2, monitoring circuitry 50 will be unable to perform monitoring of remaining operational fluid chambers 40 of primitive 41. However, if pulldown FET 62-2 is damaged and rendered inoperable, monitoring circuitry 50 may be able to continue monitoring remaining operational fluid chambers 40 if select FET 60-1 remain operational and is able to isolate sense circuitry 90 from sense node 72-2.

In addition to potential damage to the select and pulldown FETs themselves, damage to the gate structures of select and pulldown FETs 60 and 62 could potentially result in a fault current propagating to and damaging other portions of monitoring circuitry 50, such as via the Sense_Sel and Plate_PD signal lines. Compromised gate structures could also potentially lead to damage of a source region shared by adjacent select FETs 60, including the shared source contact 66 and source node 68, and which could potentially lead to damage of sense circuitry 90 via sense line 92. Again, such damage may result in monitoring circuit 50 being unable to perform monitoring of any of the fluid chambers 40 of primitive 41.

Furthermore, a fault current flowing through a drain region and into the underlying substrate, such as a fault current flowing into substrate 102 through the shared drain region "D" of select FET 60-2 and pulldown FET 64-2 from shared drain contact 74-2, may potentially damage the substrate and adjacent devices.

According to examples of the present disclosure, as will be described in greater detail herein, select and pulldown FETs 60 and 62 together with connection structures 70 are structured to form electrically conductive paths structured with electrical resistances to prevent damage to at least the select transistor from a high voltage if fluid actuators 44 short-circuit to cavitation plates 44 (or other electrodes) within fluid chambers 40 so that monitoring circuitry 50 is able to remain operational and continue monitoring operating conditions of fluid chambers 40 which remain operational.

Figure 5:
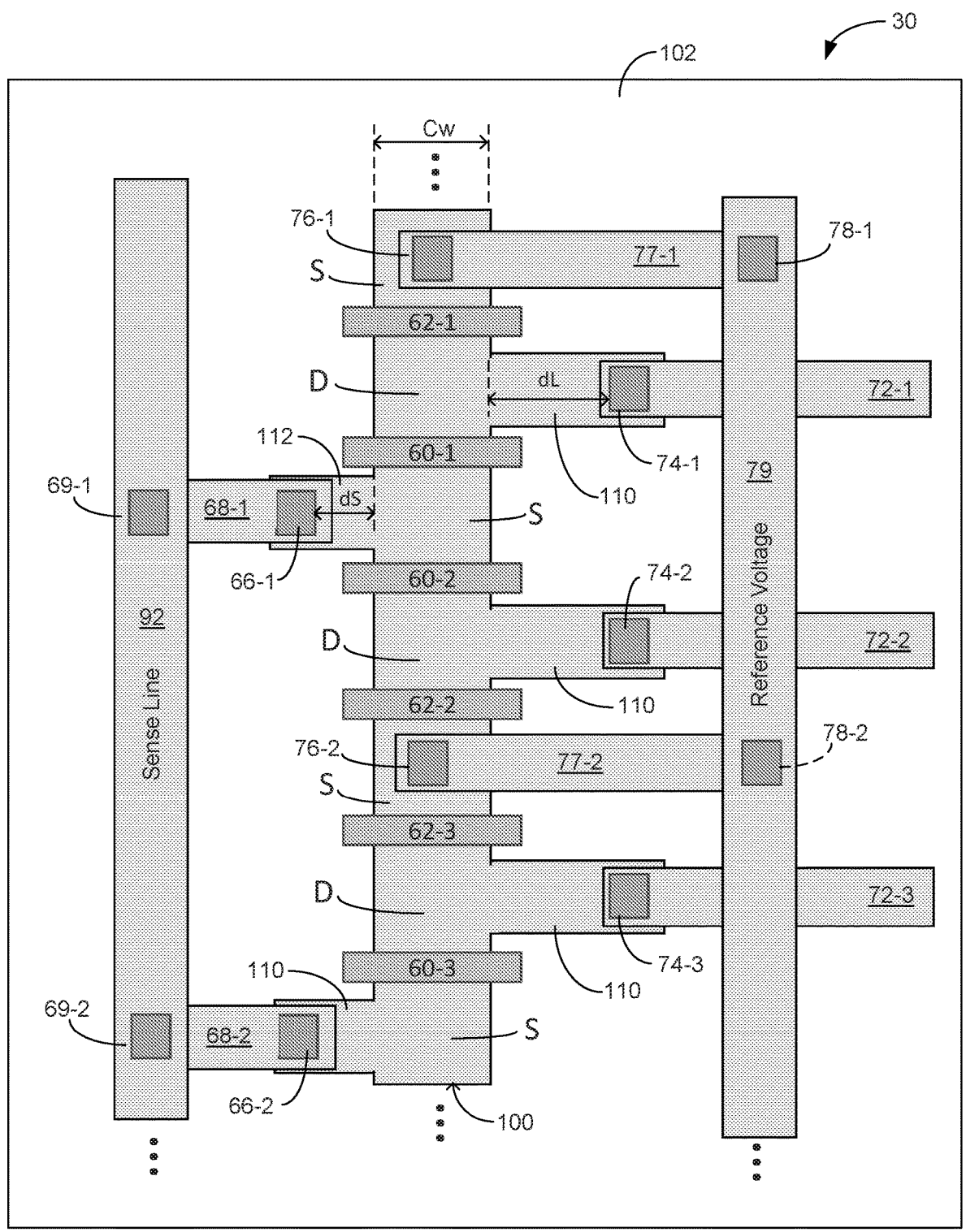
FIG. 5 is a schematic diagram illustrating a plan view of a device and wiring layout of a fluidic die, according to one example.

FIG. 5 is a plan view illustrating a simplified wiring and device layout of a portion of fluidic die 30 of FIG. 2, according to one example, where connection structure 70 and select and pulldown FETs 60 and 62 together form electrically conductive paths structured with resistances to prevent damage to select and pulldown FETs 60 and 62, and other elements of monitoring circuitry 50 upstream thereof, from a high voltage fault resulting from a fluid actuator 44 short-circuiting to a cavitation plate 42.

In one example, the shared drain region (D) of the pair of select and pulldown FETs 60 and 62 for each fluid chamber 40 includes a lateral extension 110 from the column 100 of source (S) and drain (D) regions. The shared drain contacts 74 of connection structure 70 are disposed on lateral extension 110 so as to be laterally spaced from the column of source (S) and drain (D) regions 100 by a distance dL. Laterally spacing the shared drain contact 74 beyond the width, Cw, of the column 100 of source (S) and drain (D) regions, increases a distance between shared drain contact 74 and the gate poly of corresponding select and pulldown FETs 60 and 62 so as to be greater than the minimum process distance, x, which increases an electrical resistance between shared drain contacts 74 and the gate poly of the corresponding select and pulldown FETs 60 and 62. Such arrangement of connection structure 70 and select and pulldown FETs 60 and 62 increases the electrical resistance in fashion such that a fault current resulting from a short-circuit of a fluid actuator 44 to a cavitation plate 42 is reduced in the gate regions of the corresponding select and pulldown FETs 60 and 62 and increases a resistive voltage drop across the drain region (D) between the shared drain contacts 74 and the gate regions such that a fault voltage at the gate region of the select and pulldown FETs 60 and 62 may be reduced to a level that prevents damage to the gate regions.

While such an arrangement may increase an amount of lateral (horizontal) space for monitoring circuitry 50 on fluidic die 30, a potential for fault damage to monitoring circuit 50 in the case of a fluidic actuator 44 short-circuiting to a cavitation plate 42 is reduced or eliminated. If damage can be reduced or eliminated so that the select FET 60 corresponding to the fluid chamber 40 in which such a fault occurs remains operable to disconnect sense circuitry 90 from the faulted cavitation plate 42, circuitry 50 may continue to monitor remaining fluid chambers 40 of primitive 41 which are operable.

In one example, as illustrated, the source regions (S) of select FETs 60 are also extended laterally beyond the conventional width, Cw, of the column of source (S) and drain (D) regions 100, with source contacts 66 being spaced laterally therefrom by a distance, ds. By laterally spacing source contacts 66 of select FETs 60 from the column 100 of source (S) and drain (D) regions, an electrical resistance between the gates of FETs 60 and corresponding source contacts 66 is increased, thereby reducing a likelihood that fault damage from a short circuit between a fluid ejector 44 and cavitation plate 42 will cascade from drain contacts 74 to source contacts 66.

Figure 6:
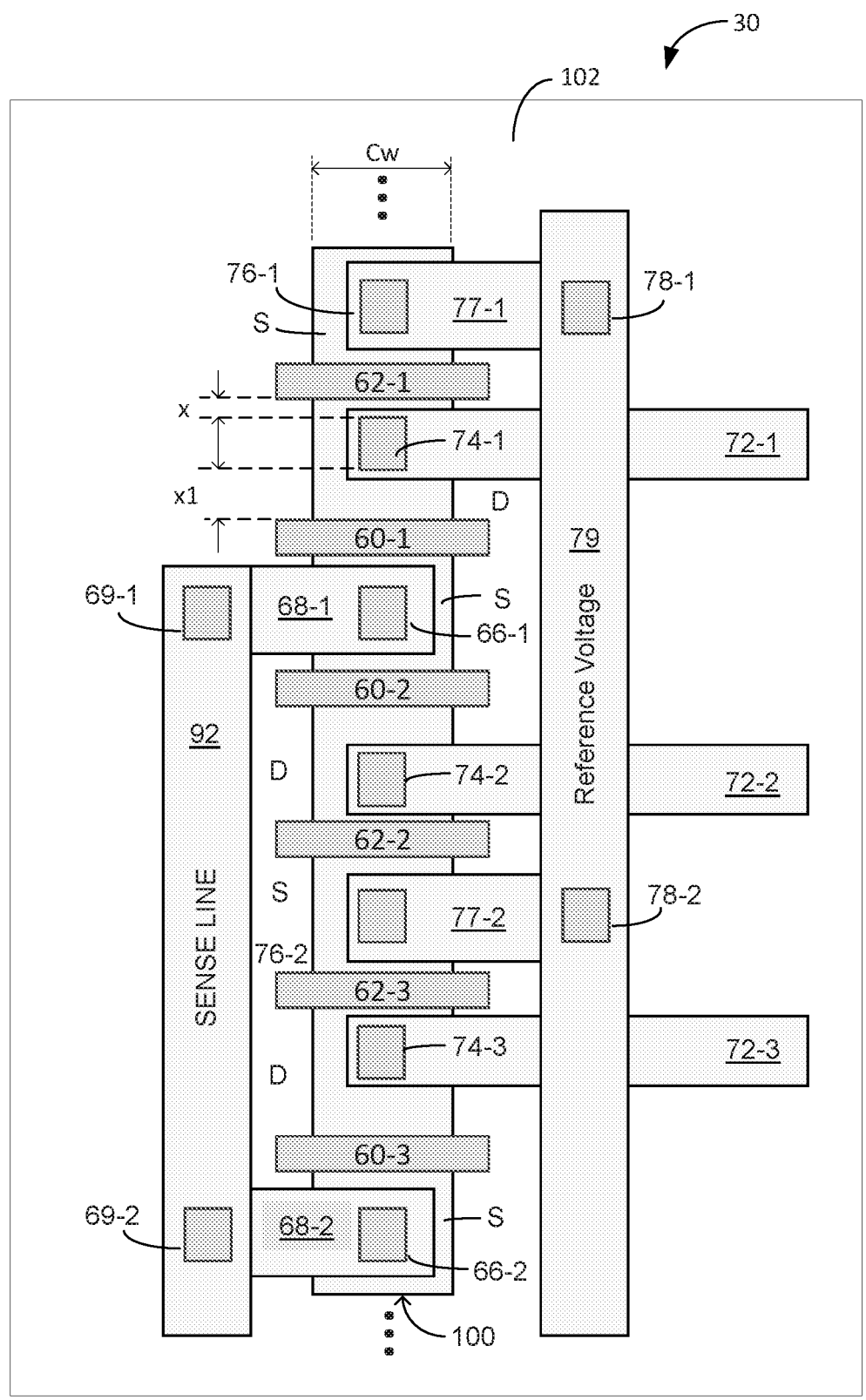
FIG. 6 is schematic diagram illustrating a plan view of a device and wiring layout of a fluidic die, according to one example.

FIG. 6 is a plan view illustrating a simplified wiring and device layout of a portion of fluidic die 30 of FIG. 2, according to one example, where connection structure 70 and select and pulldown FETs 60 and 62 together form electrically conductive paths structured with resistances to prevent damage to at least select FET 60 from a high voltage fault if a fluid actuator 44 short-circuits to cavitation plate 42.

In one example, the shared drain region (D) of the pair of select and pulldown FETs 60 and 62 of each fluid chamber 40 is extended vertically so that a distance, x', between shared drain contact 74 and the gate poly of select FET 60 is greater than the minimum process distance, x, between shared drain contact 74 and the gate poly of pulldown FET 62, such as indicated with respect to select and pulldown FETs 60-1 and 62-1. By having an asymmetrical spacing between the shared drain contact 74 and the gate poly of select and pulldown FETs 60 and 62, an electrical resistance of a current path through the shared drain region (D) from shared drain contact 74 to the gate region of select FET 60 is greater than the electrical resistance of a current path through the shared drain region (D) from shared drain contact 74 to the gate region of pulldown FET 62. As a result, a fault current from a short-circuit of a fluid actuator 44 to a cavitation plate 42 is directed away from at least the gate region of the corresponding select FET 60, with a resistive voltage drop across the drain region (D) from the shared drain contact 74 to the gate region reducing a fault voltage to a level that prevents damage to the gate region.

If damage can be reduced or eliminated to at least select FET 60 so that select FET 60 remains operable to disconnect sense circuitry 90 from a faulted cavitation plate 42, monitoring circuitry 50 may be able to continue monitoring remaining fluid chambers 40 of primitive 41 which are operable. While the arrangement of FIG. 6, reduces an amount of space required on fluidic die 30 relative to the arrangement of FIG. 5, and reduces a likelihood of damage to select FET 60, pulldown FET 62 may be exposed to damage which could compromise the gate poly such that a fault current, via the Plate_PD line, could cause additional damage and render monitoring circuitry 50 inoperable.

Figure 7:
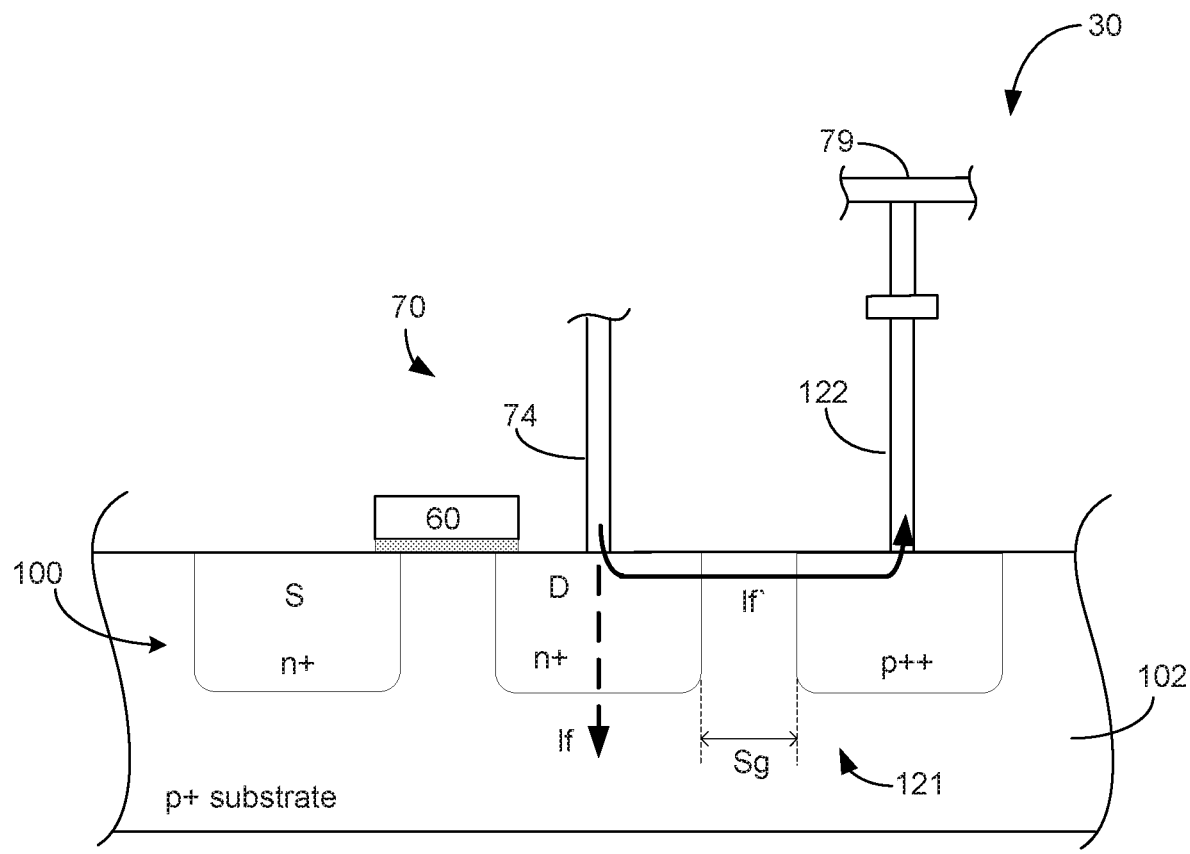
FIG. 7 is a schematic diagram illustrating a cross-sectional view of a device and wiring layout of a fluidic die, according to one example.

FIG. 7 is a schematic diagram generally illustrating a select FET 60 and portions of connection structure 70 which together form an electrically conductive path for shunting a fault current away from at least select FET 60 to prevent damage thereto, according to one example. As described above, select and pulldown FETs 60 and 62 together with connection structures 70 may be arranged to form electrically conductive paths structured with electrical resistances to prevent damage to select and pulldown FETs 60 and 62 from fault currents caused by a short-circuit between fluid actuators 44 and cavitation plates 44. However, if one of the source and drain regions of the select and pulldown FETs 60 and 62 is driven to a voltage high enough to breakdown the reverse biased diode formed by the junction between the source/drain implant region and the substrate, such as when a fluid actuator 44 short-circuits to a cavitation plate 42, a fault current will flow through the implant region and into the substrate, such as fault current IF (illustrated by the dashed line) flowing from drain contact 74 through the n+ drain region of select FET 60 and into p+ substrate 102 in FIG. 7. Such a fault current can damage that region of the substrate and potentially damage other nearby devices, such as by producing what is referred to as a runaway latch-up current event.

According to one example, a shunt implant region is disposed adjacent to the one of the source and drain regions of the select FET which may be exposed to a high voltage condition, with the shunt implant region having a conductivity type which is complementary to the adjacent one of the source and drain regions and which is same as that of the substrate, but at higher doping concentration, such as illustrated by p++ shunt implant region 120 in FIG. 7 which is adjacent to the n+ drain region of select FET 60 and which has a higher doping concentration than p+ substrate 102. In one example, p++ shunt region 120 is connected to ground line 79 (see FIG. 3) via a ground contact 122. Together, n+ drain region (D) and shunt implant region 120 form a shunt diode 121.

In one example, a breakdown voltage of the p-n junction between n+ drain region (D) and p++ shunt region 120 is less than that of the breakdown voltage between the n+ drain region (D) and p+ substrate 104. In one example, a breakdown voltage of the p-n junction between n+ drain region (D) and p++ shunt region 120 may be modified by adjusting a distance of a shunt gap, Sg, between shunt region 120 and n+ drain region (D). In one example, if the fluid actuator 44 of the corresponding fluid chamber 40 short-circuits to the cavitation plate and the high voltage of the fluid actuator 44 is present on drain contact 74, the p-n junction between n+ drain region (D) and shunt region 120 will conduct before the p-n junction between n+ drain region (D) and p+ substrate 102, so that at least a portion, $I_F'$ (illustrated by the solid line) of the fault current $I_F$ is shunted away from p+ substrate 102 and to ground via shunt region 120 and ground contact 122.

In examples, as illustrated below, shunt region 120 can be employed with or without extended drain regions (D). It is noted that for ease of illustration, a pulldown FET 62 sharing drain region (D) with select FET 60 is not shown in FIG. 7.

Figure 8:
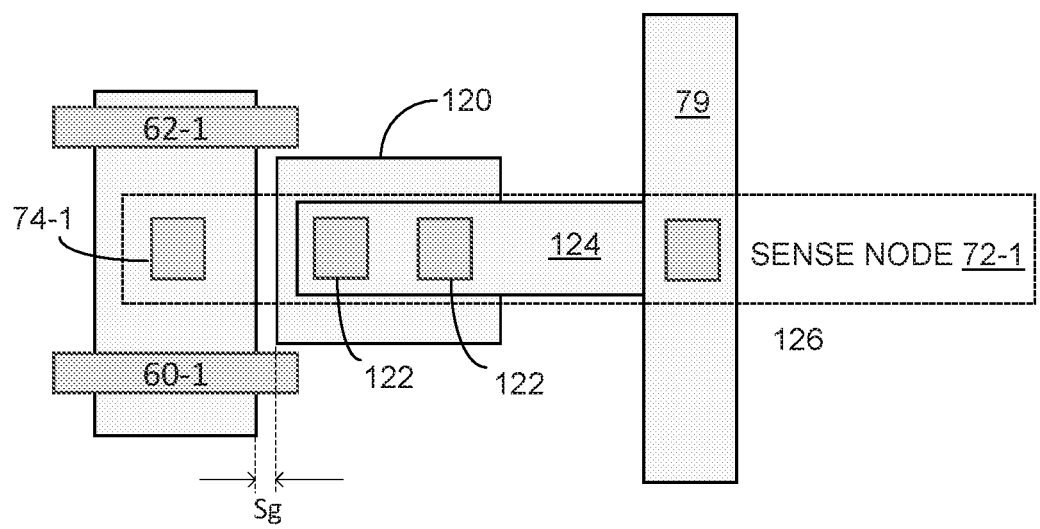
FIG. 8 is a schematic diagram illustrating a plan view of a device and wiring layout of a fluidic die, according to one example.

FIG. 8 is a plan view illustrating a simplified wiring and device layout of a portion of fluidic die 30 of FIG. 3, where a shunt region 120 is disposed adjacent to the shared drain region (D) of select and pulldown FETs 60-1 and 62-1. According to one example, shunt region 120 is connected to ground line 79 by a ground node 124, with ground node 124 connected to shunt region 114 by a pair of ground contacts 122 and to ground line 79 by a via 126, where the pair of ground contacts 122 reduces an electrical resistance and increases an ampacity of the connection between shunt region 120 and ground node 124.

Figure 9:
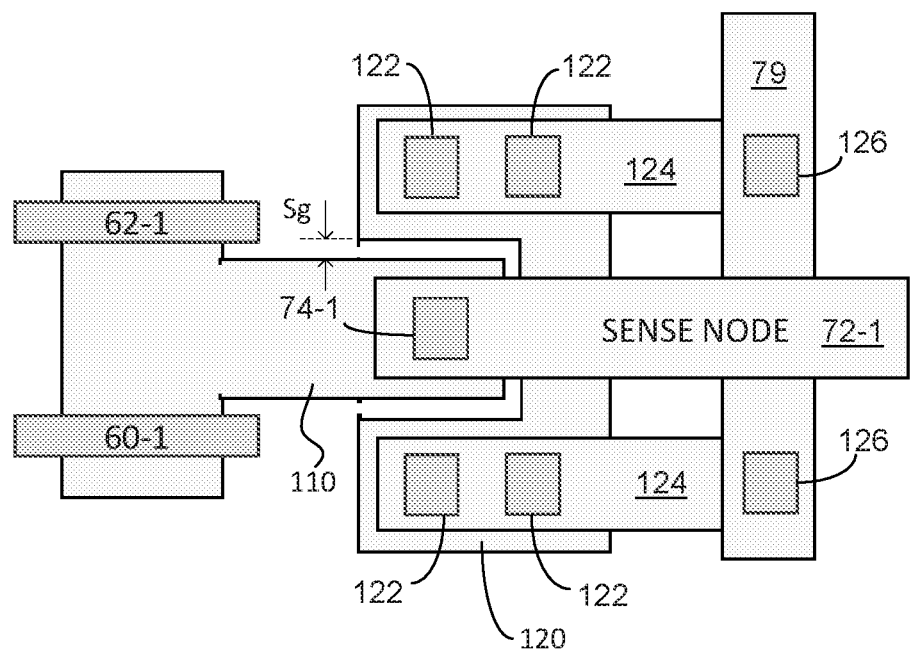
FIG. 9 is a schematic diagram illustrating a plan view of a device and wiring layout of a fluidic die, according to one example.

FIG. 9 is a plan view illustrating a simplified wiring and device layout of a portion of fluidic die 30 of FIG. 5, where a shunt region 120 is disposed adjacent share drain contact 74-1 disposed on the lateral extension 110 of the shared drain region (D) of select and pulldown FETs 60-1 and 62-1. According to one example, shunt region 120 is connected to ground line 79 by a pair of ground nodes 124, with ground nodes 124 connected to shunt region 114 by a pair of ground contacts 122 and to ground line 79 by via 126.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A fluidic die comprising:
  a plurality of fluid chambers, each including an electrode exposed to an interior of the fluid chamber and each having a corresponding fluid actuator operating at a high voltage; and
  monitoring circuitry, operating at a low voltage relative to the fluid actuator, to monitor a condition of each fluid chamber, for each chamber the monitoring circuitry including:
    a connection structure; and
    a select transistor and a pulldown transistor connected to the electrode via the connection structure, the connection structure and select and pulldown transistors together structured to form electrically conductive paths with electrical resistances to protect at least the select transistor from fault damage if the high voltage fluid actuator short-circuits to the electrode.

2. The fluidic die of claim 1, the select and pulldown transistors structured to share one of a drain region and a source region, the shared one of the drain and source regions having a first conductivity type implanted in a substrate having a second conductivity type complementary to the first conductivity type and forming a PN junction with the substrate having a first breakdown voltage less than the high voltage, the connection structure including:
  a shared contact connecting the shared one of the drain and source regions to the electrode; and
  a shunt implant region of the second conductivity type having a greater doping concentration than the substrate, the shunt implant region disposed adjacent to and spaced from the shared one of the drain and source regions and connected to a reference voltage, a pn-junction between the shunt implant region and the shared one of the drain and source regions having a second breakdown voltage less than the high voltage and less than the first breakdown voltage.

3. The fluidic die of claim 1, the connection structure including a shared contact, the select and pulldown transistors structured to share one of a drain region and a source region connected to the electrode by the shared contact, the shared contact and the shared one of the source and drain regions structured to form an electrically conductive path through the shared one of the drain and source regions from the shared contact to a gate region of at least the select transistor having a path length greater than a minimum process distance to provide an electrical resistance to produce a resistive voltage drop in response to a fault current resulting from a short-circuit of the high-voltage fluid actuator to the electrode so that a fault voltage level at the gate region of the select transistor is below a voltage level at which damage occurs to a gate of the select transistor.

4. The fluidic die of claim 3, the drain and source regions of the select and pulldown transistors arranged in a column in a substrate, the column extending in a first direction, an electrically conductive path through the shared one of the drain and source regions from the shared contact to a gate region of the pulldown transistor structured to have a path length of a minimum process distance.

5. The fluidic die of claim 3, the shared contact and the shared one of the source and drain regions structured to form an electrically conductive path through the shared one of the drain and source regions from the shared contact to a gate region of the pulldown transistor having a path length greater than the minimum process length to provide an electrical resistance to produce a resistive voltage drop in response to the fault current so that a fault voltage level at the gate region of the pulldown transistor is below a voltage level at which damage occurs to a gate of the pulldown transistor.

6. The fluidic die of claim 5, the drain and source regions of the select and pulldown transistors disposed in a column in a substrate extending in a first direction and having a column width in a second direction perpendicular to the first direction, the shared one of the drain and source regions having an extension in the second direction beyond the width of the column on which the shared contact is disposed.

7. The fluidic die of claim 6, the other of the drain and source region of the select transistor shared with the other of a drain and a source region of a select transistor of an adjacent fluid chamber and having a horizontal extension beyond the width of the column with a corresponding shared contact disposed thereon and connected to sense circuitry of the monitoring circuitry.

8. The fluidic die of claim 6, the shared one of the drain and source regions having a first conductivity type implanted in a substrate having a second conductivity type complementary to the first conductivity type, the connection structure including a shunt implant region of the second conductivity type and having a greater doping concentration than the substrate, the shunt implant region disposed adjacent to and spaced from the shared one of the drain and source regions proximate to the shared contact, a pn-junction between the shunt implant region and the shared one of the drain and source regions having a breakdown voltage less than the high voltage and greater than a breakdown voltage of a pn-junction between the shared one of the drain and source regions and the substrate, the shunt implant region electrically connected to a reference voltage.

9. The fluidic die of claim 1, the select and pulldown transistors comprising one of a low-voltage NMOS FET and PMOS FET.

10. A fluidic die comprising:
a fluid chamber including an internal electrode and having a corresponding fluid actuator operating at a high voltage; and
low-voltage monitoring circuitry including:
a select transistor and a pulldown transistor to selectively couple to the electrode via a shared drain region connected to the electrode, the shared drain region comprising an implant of a first conductivity type in a substrate of a second conductivity type; and
a shunt implant region of the second conductivity type, having a greater doping concentration than the substrate, forming a junction with the drain region having a breakdown voltage less than the high voltage and greater than a breakdown voltage of a junction between the drain region and substrate, the shunt implant region to shunt from the drain region to ground at least a portion of a fault current resulting from a short-circuit of the fluid actuator to the electrode.

11. The fluidic die of claim 10, the shared drain region connected to the electrode by a shared drain contact, a distance through the shared drain region from the shared drain contact to a gate region of the select transistor and a distance from the shared drain contact through the shared drain region to a gate region of the pulldown transistor each equal to a minimum process distance.

12. The fluidic die of claim 10, the shunt implant region spaced from the shared drain region by a shunt gap, a distance of the shunt gap selected to control a breakdown voltage of the pn-junction between the shared drain region and the shunt implant region.

13. The fluidic die of claim 10, the shared drain region disposed in the substrate in a column extending in a first direction and including an extension extending beyond a width of the column a second direction perpendicular to the first direction, the shared contact disposed on the extension.

14. A fluidic die comprising:
a plurality of fluid chambers, each including a cavitation plate and each having a corresponding fluid actuator operating at a high voltage; and
monitoring circuitry, operating at a low voltage relative to the fluid actuator, to monitor a condition of each fluid chamber, the monitoring circuitry including:
sense circuitry; and
for each fluid chamber:
a select transistor and a pulldown transistor sharing a drain region; and
a drain contact to connect the drain region to the electrode, the select and pulldown transistors to selectively couple the sense circuitry to the cavitation plate via the drain contact, the drain shared drain region and drain contact arranged to form electrically conductive paths with electrical resistances structured to protect at least the select transistor from damage if the high voltage fluid actuator faults to an electrode.

15. The fluidic die of claim 14, the select and pulldown transistors comprising NMOS FETs.

* * * * *